United States Patent [19]

Tamura et al.

[11] 4,423,464

[45] Dec. 27, 1983

[54] VARIABLE CAPACITANCE TYPE PUSH-BUTTON SWITCH

[75] Inventors: Ryutaro Tamura; Yasushi Endo, both of Iwaki, Japan

[73] Assignee: Alps Electric Co., Ltd., Tokyo, Japan

[21] Appl. No.: 253,588

[22] Filed: Apr. 13, 1981

[30] Foreign Application Priority Data

Apr. 16, 1980 [JP] Japan ................... 55-49826

[51] Int. Cl.³ ............................................. H01G 5/01
[52] U.S. Cl. .................................................... 361/288
[58] Field of Search .................................. 361/288, 323

[56] References Cited

U.S. PATENT DOCUMENTS

| 3,530,344 | 9/1970 | Katchman | 361/323 |
|---|---|---|---|
| 3,588,875 | 6/1971 | Gabor | 340/347 |
| 3,665,126 | 5/1972 | Gabor | 200/5 E |
| 3,965,399 | 6/1976 | Walker | 361/288 |

FOREIGN PATENT DOCUMENTS

| 1940554 | 2/1971 | Fed. Rep. of Germany . | |
| 49-11513 | 5/1970 | Japan | 361/323 |
| 46-37972 | 10/1971 | Japan | 361/323 |
| 51-30973 | 9/1976 | Japan . | |
| 1223099 | 2/1971 | United Kingdom . | |
| 1443174 | 7/1976 | United Kingdom . | |
| 1555628 | 11/1979 | United Kingdom . | |

Primary Examiner—Donald A. Griffin
Attorney, Agent, or Firm—Guy W. Shoup; Gerard F. Dunne

[57] ABSTRACT

A capacitance type push-button switch which includes a movable member carried by the lower end of a key stem and including a holding member made of an elastic material of high compressibility and having a convex lower surface, a movable electrode made of an electrically conductive and flexible material held to the lower surface of the holding member, a dielectric film carried by the movable electrode and comprised of a synthetic resin of a fluoride type which can be brought into contact with two stationary electrodes to vary the capacitance therebetween, means including a pair of suspending pieces each carrying at their lower end portions a respective pawl adapted to engage the holding member when it is raised to its upper position for holding it in place, and means for releasing the pawls to bring the dielectric film into pressed contact with the stationary electrodes.

13 Claims, 4 Drawing Figures

VARIABLE CAPACITANCE TYPE PUSH-BUTTON SWITCH

The present invention relates to a push-button switch and, more particularly, to a type of push-button switch operable to change its capacitance value upon actuation of the push-button.

In, for example, data input devices, switches of high reliability are required, and variable capacitance type push-button switches (hereinbelow, briefly termed "capacitance type switches") have thus come into wide use. In such switches, two capacitance levels are used to produce binary signals and thus the difference between these two capacitance levels needs to be made sufficiently great. To this end, a dielectric material of high permittivity is often used in such switches.

FIG. 1 is a sectional view of the essential portions of a known capacitance type switch, and principally illustrates the electrical construction of the switch. As shown in FIG. 1, a push rod 31 carries a movable electrode 36 having a dielectric film 35 thereover. The electrode 36 is movable relative to a pair of stationary electrodes 33 and 34 disposed on an insulating substrate 32. One of the stationary electrodes, such as electrode 33, serves as an input and the other electrode serves as the output of the switch. The push rod 31 descends to bring the dielectric film 35 into close contact with the stationary electrodes 33 and 34, thereby functioning to connect the pair of stationary electrodes by capacitance coupling of an a.c. signal. In FIG. 1, let $d_a$ and $d_f$ denote the thicknesses of the air gap and the dielectric film 35 respectively, S denote the surface area of the movable electrode 36, $\epsilon_a$ and $\epsilon_f$ denote the relative permittivities of the air and the dielectric film 35 respectively, and $\epsilon_o$ denote the permittivity of free space in farads per meter. In addition, let $C_1$ denote the capacitance between only the stationary electrode 33 and the movable electrode 36, and similarly let $C_2$ correspond to the capacitance between the other stationary electrode 34 and the movable electrode. Since the spacing between the two stationary electrodes is small, the area of each of the stationary electrodes 33 and 34 can be considered S/2. Since the capacitance $C_1$ is the series coupling consisting of the capacitance $$C_a = \frac{\epsilon_o \epsilon_a \cdot S/2}{d_a}$$

of the air layer and a capacitance $$C_f = \frac{\epsilon_o \epsilon_f \cdot S/2}{d_f}$$

based on the dielectric film 35, the following holds:

$$C_1 = \frac{\epsilon_o \epsilon_a \epsilon_f S}{2(\epsilon_f d_a + \epsilon_a d_f)} \text{ [farad]}$$

Further, letting C denote the combined capacitance resulting from the series coupling of the capacitances $C_1$ and $C_2$, and assuming that the stationary electrodes are formed in the same shape and in the same dimensions so that $C_1 = C_2$, the following relationship vs obtained:

$$\frac{1}{C} = \frac{1}{C_1} + \frac{1}{C_2} = \frac{2}{C_1}$$

Accordingly, $$C = \frac{C_1}{2} = \frac{1}{2} \cdot \frac{\epsilon_o \epsilon_a \epsilon_f S}{2(\epsilon_f d_a + \epsilon_a d_f)} = \frac{\epsilon_o \epsilon_a \epsilon_f S}{4(\epsilon_f d_a + \epsilon_a d_f)} \text{ [farad]}$$

Here, $\epsilon_o = 8.855 \times 10^{-12}$ (F/m) and $\epsilon_a = 1$. By changing the units into $p^F$ (picofarad), therefore, the above expression is rewritten as follows:

$$C = 0.08855 \times \frac{\epsilon_f S}{4(d_f + \epsilon_f d_a)} \text{ [pF]} \quad (1)$$

When the switch is actuated into its digital state considered the "on" state, $d_a = 0$ and $$C = 0.08855 \times \frac{\epsilon_f S}{4 d_f} \text{ [pF]}. \quad (2)$$

The unit of $d_a$ and $d_f$ is cm, and the unit of S is cm².

As is apparent from Equation (2), as the relative permittivity $\epsilon_f$ of the dielectric film 35 is made higher or the thickness $d_f$ thereof is made smaller, the change of the capacitance between the two levels of the switch becomes greater, so that the operation of the switch becomes more reliable.

When a push-button switch of the type described is manufactured to take advantage of the above relationships, the thickness of the dielectric film cannot be made too thin or any variances throughout the thickness of the film can cause unexceptably high variances in the capacitance levels of the switch. Additionally, handling of the movable electrode during manufacturing becomes quite difficult due to the low mechanical strength of the dielectric film. Accordingly, the film thickness cannot be made smaller than a certain fixed value. This makes it desirable to use a material for the dielectric film whose permittivity is as high as possible. As the dielectric material, film of polyethylene terephthalate (PET), polypropylene (PP), etc. are the commonest, but they all exhibit low permittivities generally in the range of 2-4. With these materials, accordingly, it has been difficult to obtain a capacitance type switch which has reliable operation between its two states.

The inventors of the present invention expected that, when a dielectric material of polymer composition having an especially high permittivity, such as polyvinylidene fluoride (PVDF) was used in order to eliminate the above disadvantage of the known switch, the difference between the capacitance levels at the opening and closure of the switch could be made great. However, they encountered the problem that in the switch in which both the movable electrode and the stationary electrodes are formed of rigid structures, as shown in FIG. 1, the capacitance change expected from the permittivity and thickness of the dielectric material could not be readily attained. As the result of a still deeper study on the cause, the following has been revealed.

Using films of PET (permittivity: 3) and PVDF (permittivity: 11) 5μ, 10μ and 20μ thick as dielectric materials, and setting S=0.5 cm², the capacitances C of the switch in FIG. 1 were calculated according to Equation (1) for various spacings $d_a$, and plotted to obtain the graph shown in FIG. 4. As seen from this graph, noting the PET film 20μ thick, the capacitance C for $d_a=0$ is about 17 pF, while the capacitances C for $d_a=1μ$ and 0.1μ are about 14 pF and about 16.5 pF respectively, and reach about 82% and 97% of the capacitance C for $d_a=0$ respectively. On the other hand, regarding the PVDF film 20μ thick, the capacitance C for $d_a=0$ is about 60 pF, while the capacitances C for $d_a=1μ$ and 0.1μ are about 38 pF and about 55 pF respectively, which is about 66% and 91% of the value for $d_a=0$ respectively, so the change in capacitance level between the thicknesses 1μ and 0.1μ is much greater. These % values become smaller with a decrease in the thickness of the film or with increase in the permittivity of the film, and they become about 48% and 90% in case of the PVDF film 10μ thick.

This analysis indicates that, with a material of comparatively low permittivity such as PET or a film of comparatively great thickness, the capacitance does not vary greatly with a variance in the minimal spacing between the electrodes. That is, in this case, the capacitance for $d_a=0$ is comparatively small, and besides, the capacitance change dependent upon $d_a$ is small, so that especially high tolerances for the degree of close contact between the electrodes is not very significant.

On the other hand, when expecting a great capacitance variation with a dielectric material which has a high permittivity and which is thin, it becomes necessary to design the switch so that the smallest possible vacant space remains when the movable electrode is moved fully toward the stationary electrodes.

In the case where, in the construction of FIG. 1, both the movable electrode and the pair of underlying stationary electrodes are rigid structures not easily deformed by actuating the push rod 31, even a slight deviation in the flatness of the surface of the upper or lower electrodes adversely effects the parallelism between the upper and lower electrodes and the perfect vertical movement of the moving electrode. Consequently, the close contact of at least one electrode on the input side or the output side is adversely effected.

It is, therefore, an object of the present invention to overcome such deficiencies.

In a variable capacitance type push-button switch of the present invention, therefore, in order to permit a movable electrode to come into close contact with a pair of underlying electrodes uniformly and precisely, the holding member for the movable electrode is made of an elastic material of high compressibility and is disposed between the electrodes and a key stem. Further, the movable electrode itself is highly flexible for it is made of a metal foil or metal evaporated film of the like on whose surface is provided a dielectric film of a polymer composite of high permittivity so as to be able to come into uniform and close contact with the lower electrodes.

These and other advantages and features of the present invention will become further apparent from the following description of a preferred embodiment made in conjunction with the accompanying drawing figures, in which.

Figure 1:
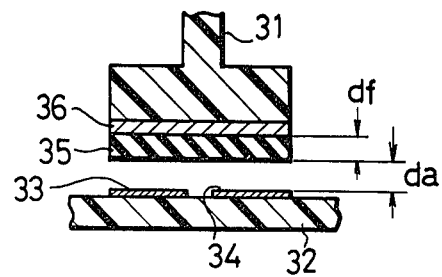
FIG. 1 is a side sectional view illustrating schematically essential portions of a known switch.
Figure 2:
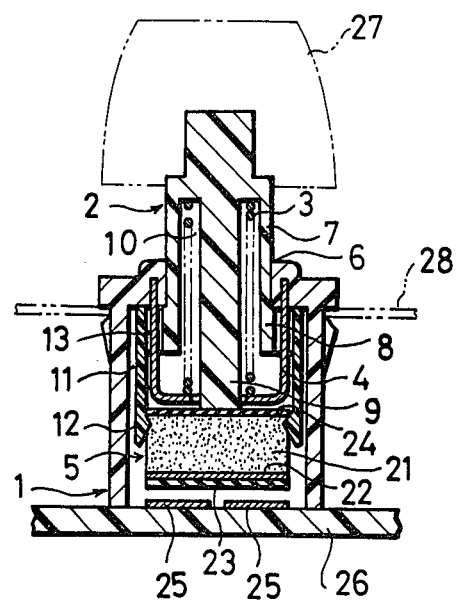
FIG. 2 is a side sectional view of a switch according to the present invention.

FIG. 2 shows the construction of one embodiment of a capacitance type switch according to the present invention. A case 1 made of a synthetic resin receives slidably a key stem 2 made of a synthetic resin and having a coiled spring 3 fitted therein as shown for urging the key stem upwardly. A mounting plate 4 is fixed to the bottom of the upper part of the case 1 and functions as a resilient portion engaging the spring 3 and also for limiting the descent of the key stem 2. Since the vertical part of the mounting plate 4 penetrates through a vertical slot 13 provided in the outer diameter portion 8 of the key stem 2, the key stem 2 moves up and down quite freely. The small diameter portion 7 of the key stem 2 is inserted snugly through an opening 6 provided in the top plate of the case 1. A movable member 5 is held by the lower end of a rod 9 and a pawl 12 formed at the lower end of a suspending piece 11. Further, the spring 3 is received in an interstice portion 10 and a knob 27 of suitable shape is attached to the upper part of the key stem 2. On an insulating substrate 26, a pair of stationary electrodes 25 are disposed in opposition to the movable member 5 and the entire switch is fitted to a panel 28 or the like for mounting the switch.

Figure 3:
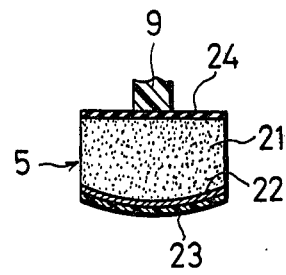
FIG. 3 is a side sectional view showing essential features of another embodiment of the present invention.

The movable member 5 includes a plate member 24 made of a hard material and a buffer member 21 made of a material of high compressibility and elasticity. A movable electrode 22, and a dielectric film 23 are adhered to the lower portion of the buffer member 21. Regarding the manufacturing process of this portion, a flexible dielectric film material which is, for example, vacuum-coated with a metal such as aluminum in advance is prepared, and the evaporated metal surface of the film material is bonded to the lower surface of the buffer member 21, whereby the movable electrode 22 and the dielectric film 23 are formed. However, this is not restrictive, but any construction may be employed insofar as it has a flexibility and a pliability so that the dielectric film 23 may come into uniform and close contact with the pair of stationary electrodes when the key stem 2 is depressed. By way of example, a barrel-like configuration in which the central part of the buffer member 21 is somewhat thicker than both the end parts so that the buffer member 21 presents a convex lower surface as shown in FIG. 3 is more favorable because the movable member 5 makes a greater contact with the stationary electrodes 25 when the former comes into contact with the latter.

The movable electrode 22, the dielectric film 23 and the stationary electrodes 25 form a kind of variable capacitor. In the present invention, as the dielectric film 23, a film made of a polymer composite having a permittivity much higher than those of the conventional dielectric materials is preferred, for example, a polyvinylidene fluoride type of synthetic resin.

Such polymer composites of high permittivities are broadly classified into homopolymers and copolymers. Hereunder, they will be respectively described.

As the composites of the homopolymers, there are metioned, for example, homopolymers such as polyvinyl fluoride and polyvinylidene fluoride and homopolymers obtained by polymerizing ethylene trifluoride or vinylidene chlorofluoride, the latter having the structural formula:

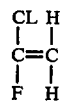

Among such composites produced by polymerizing only one sort of monomer (that is, homopolymers), the second-mentioned polyvinylidene fluoride exhibits the highest permittivity.

Now, the copolymers will be explained. Among the copolymers which are produced by mixing and polymerizing one monomer and another monomer copolymerizable therewith, there are ones of high permittivities, that is, ones whose relative permittivities are 8 or greater. For example, the copolymer between vinylidene fluoride (monomer) and another monomer (e.g., ethylene trifluoride) is appropriate as the dielectric in the present invention.

Figure 4:
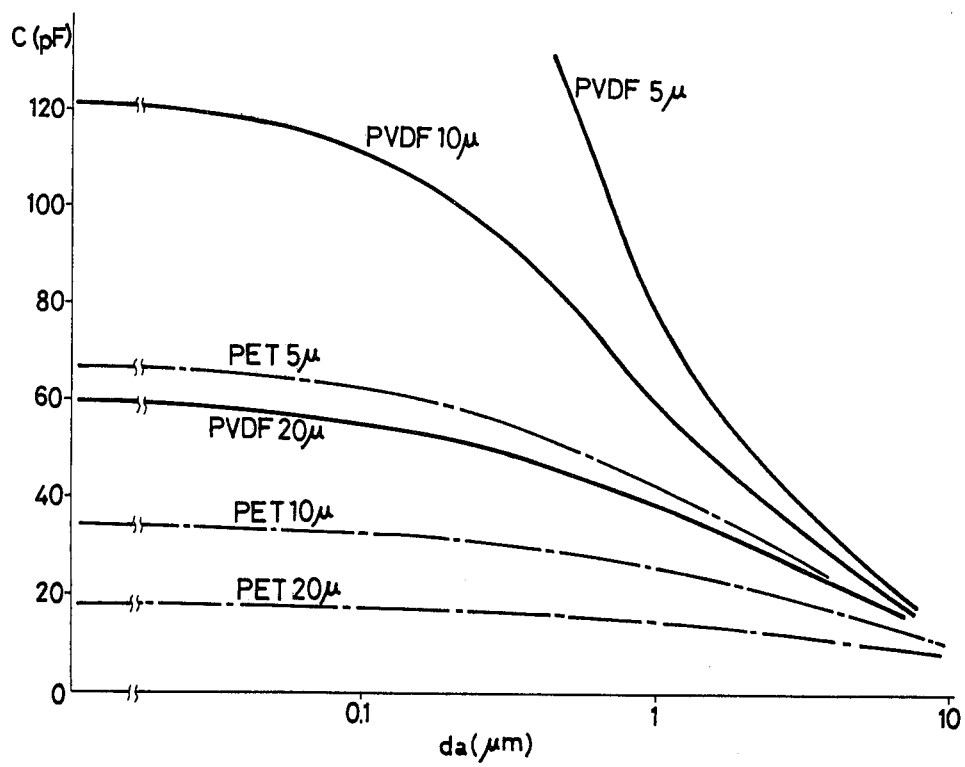
FIG. 4 is a graph illustrating the relationship between the electrode spacing and construction of the dielectric film.

It has previously been explained in connection with FIG. 4 that the aforecited polyvinylidene fluoride is appropriate as the dielectric in the present invention. The present invention may employ a polyvinylidene fluoride film whose permittivity has been raised by biaxial drawing the material. This film exhibits a relative permittivity $\epsilon_f$ of 10–13 at 1 kHz at normal temperature, and the relative permittivity $\epsilon_f$ has a value of 8–10 even at 100 kHz. The film can also be manufactured by a uniaxial drawing treatment, and a relative permittivity $\epsilon_f$ near, at most, 18 is attained in this case. Since, however, the biaxial drawing is desired in mass producing the film, the biaxially drawn film has been chiefly used in the present invention.

Regarding the film of the copolymer of the vinylidene flouride type, a copolymer produced by mixing vinylidene fluoride and ethyelne triflouride in equivalent molar proportions is drawn, whereby a relative permittivity $\epsilon_f$ at 1 kHz reaches about 15 at normal temperature. This film can be effectively used as the dielectric film of the present invention similarly to the drawn film of polyvinylidene fluoride.

In the capacitance type switch of the present invention, the movable electrode has flexibility, and further, is supported by a holding member made of an elastic material of high compressibility, so that when the push button is depressed, the movable electrode can be easily deformed to come into uniform and close contact with the pair of stationary electrodes and thus minimize any air gap. Moreover, a thin film of high permittivity such as polyvinylidene fluoride film is used as the dielectric material, and a capacitance close to a value at the perfect contact expected from the characteristics of the film is reliably attained, so that the difference between the capacitances of the two states of the switch can be made great. In addition, when the movable electrode is a metallic thin film evaporated on the high permittivity film, both the movable electrode layer and the dielectric layer are thin and very pliable, and a layer of low permittivity such as that of a binder does not exist between the movable electrode and the dielectric layer, so that the structure is very favorable for attaining a high capacitance. Besides, this structure brings forth a very high production efficiency because it is only required to bond the evaporated surface of the metal evaporated film to a buffer member of polyurethane or the like.

Furthermore, with the PET film, PP film etc., the variations of the capacitances are small, and hence, thinner films need to be used in order to increase them. This results in a liability in the development of wrinkles or damages in the manufacturing process, and the development of the wrinkles leads to an increase in the vacant space at the closure of the switch and forms a cause for unreliable operation. In contrast, with the film of high permittivity, the thickness of the film in the case of attaining an identical capacitance can be made greater, so that the present invention makes sharp improvements both in point of the job efficiency in manufacture and in point of the electrical performance.

As set forth above, according to the present invention, a dielectric film which is flexible and which is coated with a metal by evaporation is adhered to a buffer member, and the dielectric film is made of a polymer composite of high permittivity, so that a capacitance type switch whose capacitance varies little, whose switching operation is reliable and whose signal-to-noise ratio (S/N ratio) is high can be provided, that the mass-producibility can be sharply improved, and that great effects can be achieved in industry.

What is claimed is:

1. In a variable capacitance type push-button switch comprising a case made of an insulating material; an insulating substrate held to said case and carrying stationary electrodes; a key stem movable vertically within said case; and a movable member carried by the lower end of said key stem; the improvement wherein said movable member includes a holding member made of an elastic material of high compressibility and having a lower surface substantially convex in section, a movable electrode made of an electrically conductive and flexible material held to said lower surface of said holding member, and a dielectric film carried by said movable electrode and comprised of a synthetic resin of a fluoride type having a relative premittivity of at least eight; and means for depressing said key stem to bring said movable member into engagement with said substrate to deform said lower surface into a more planar configuration and press said dielectric film into pressed contact with said stationary electrodes.

2. A variable capacitance type push-button switch as defined in claim 1, wherein the dielectric film is a homopolymer produced by polymerizing one monomer selected from the group consisting of vinyl fluoride, vinylidene fluoride, ethylene trifluoride and vinylidene chlorofluoride.

3. A variable capacitance type push-button switch as defined in claim 1, wherein the dielectric film is made of polyvinylidene fluoride.

4. A variable capacitance type push-button switch as defined in claim 3, wherein the dielectric film made of polyvinylidene fluoride is formed by biaxial drawing and has a relative permittivity in the range of 10 to 13 at 1 kHz at normal temperature.

5. A variable capacitance type push-button switch as defined in claim 1, wherein the dielectric film is made of a copolymer of vinylidene fluoride and another monomer.

6. A variable capacitance type push-button switch as defined in claim 5, wherein the dielectric film is made of a copolymer of vinylidene fluoride and ethylene trifluoride.

7. A variable capacitance type push-button switch as defined in claim 1, said case including a pair of suspending pieces extending downwardly from a top surface thereof and each carrying at their lower end portions a respective pawl adapted to engage said holding member when it is raised to its upper position.

8. A variable capacitance type push-button switch comprising a case made of an insulating material; an insulating substrate held to said case and carrying stationary electrodes; a key stem movable vertically within said case; and a movable member carried by the lower end of said key stem; the improvement wherein said movable member includes a holding member made of an elastic material of high compressibility, a movable electrode made of an electrically conductive and flexible material held to said holding member, and a dielectric film formed on the lower surface of said movable electrode and comprised of a synthetic resin of a fluoride type; means including a pair of suspending pieces extending downwardly from a top surface of said case and each carrying at their lower end portions a respective pawl adapted to engage said holding member when it is raised to its upper position for holding it in place; and means for depressing said key stem to release said holding member from said pawls to bring said movable member into engagement with said substrate to bring said dielectric film into pressed contact with said stationary electrodes.

9. A variable capacitance type push-button switch as defined in claim 8, wherein the dielectric film is a homopolymer produced by polmerizing one monomer selected from the group consisting of vinyl fluoride, vinylidene fluoride, etyhlene trifluoride and vinylidene chlorofluoride.

10. A variable capacitance type push-button switch as defined in claim 8, wherein the dielectric film is made of polyvinylidene fluoride.

11. A variable capacitance type push-button switch as defined in claim 10, wherein the dielectric film made of polyvinylidene fluoride is formed by biaxial drawing and has a relative premittivity in the range of 10 to 13 at 1 kHz at normal temperture.

12. A variable capacitance type push-button switch as defined in claim 8, wherein the dielectric film is made of a copolymer of vinylidene fluoride and another monomer.

13. A variable capacitance type push-button switch as defined in claim 12, wherein the dielectric film is made of a copolymer of vinylidene fluoride and ethylene trifluoride.

* * * * *

UNITED STATES PATENT AND TRADEMARK OFFICE
CERTIFICATE OF CORRECTION

PATENT NO. : 4,423,464

DATED : December 27, 1983

INVENTOR(S) : Yasushi Endo

It is certified that error appears in the above-identified patent and that said Letters Patent is hereby corrected as shown below:

On the title page, add second assignee

-- and Kureha Kagaku Kogyo Co., Ltd. --.

Signed and Sealed this

Eighth Day of October 1985

[SEAL]

Attest:

Attesting Officer

DONALD J. QUIGG

Commissioner of Patents and Trademarks—Designate